United States Patent
Taira et al.

(10) Patent No.: US 8,426,726 B2
(45) Date of Patent: Apr. 23, 2013

(54) SOLAR CELL MODULE AND METHOD OF MANUFACTURING THE SAME

(75) Inventors: Shigeharu Taira, Moriguchi (JP); Eiji Maruyama, Moriguchi (JP)

(73) Assignee: Sanyo Electric Co., Ltd, Moriguchi-shi (JP)

( * ) Notice: Subject to any disclaimer, the term of this patent is extended or adjusted under 35 U.S.C. 154(b) by 0 days.

(21) Appl. No.: 12/362,691

(22) Filed: Jan. 30, 2009

(65) Prior Publication Data
US 2009/0194144 A1 Aug. 6, 2009

(30) Foreign Application Priority Data

Jan. 31, 2008 (JP) .................................. 2008-021125
Dec. 17, 2008 (JP) .................................. 2008-321530

(51) Int. Cl.
*H02N 6/00* (2006.01)
*H01L 31/042* (2006.01)
*H01L 31/00* (2006.01)
*H01L 21/00* (2006.01)

(52) U.S. Cl.
USPC ............................. 136/256; 136/244; 438/98

(58) Field of Classification Search .................. 136/243, 136/244, 251, 252, 256; 438/98
See application file for complete search history.

(56) References Cited

U.S. PATENT DOCUMENTS

| | | | |
|---|---|---|---|
| 3,673,843 A | 7/1972 | Diolot | |
| 4,525,594 A | 6/1985 | Pschunder | |
| 5,391,235 A * | 2/1995 | Inoue | 136/244 |
| 5,942,048 A * | 8/1999 | Fujisaki et al. | 136/256 |
| 2004/0118337 A1* | 6/2004 | Mizutani et al. | 117/54 |
| 2004/0200522 A1* | 10/2004 | Fukawa et al. | 136/259 |
| 2007/0215196 A1* | 9/2007 | Nakashima et al. | 136/243 |
| 2007/0235077 A1* | 10/2007 | Nagata et al. | 136/256 |

FOREIGN PATENT DOCUMENTS

| | | |
|---|---|---|
| EP | 0115803 A2 | 1/1984 |
| FR | 1587260 A | 3/1970 |
| FR | 1587268 A | 3/1970 |
| JP | 58039073 A | 3/1983 |
| JP | 59115576 A | 7/1984 |
| JP | 10-093120 A | 4/1998 |

* cited by examiner

*Primary Examiner* — Jennifer Michener
*Assistant Examiner* — Eli Mekhlin
(74) *Attorney, Agent, or Firm* — Marvin A. Motsenbocker; Mots Law, PLLC

(57) ABSTRACT

A wiring member is arranged to have a protruding portion extending beyond a bonding layer at its end in the extending direction 13 Claims, 14 Drawing Sheets

ARRANGING DIRECTION

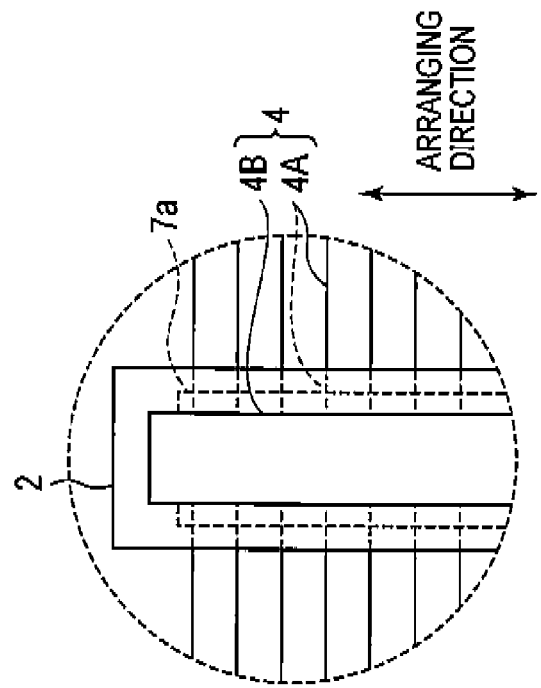
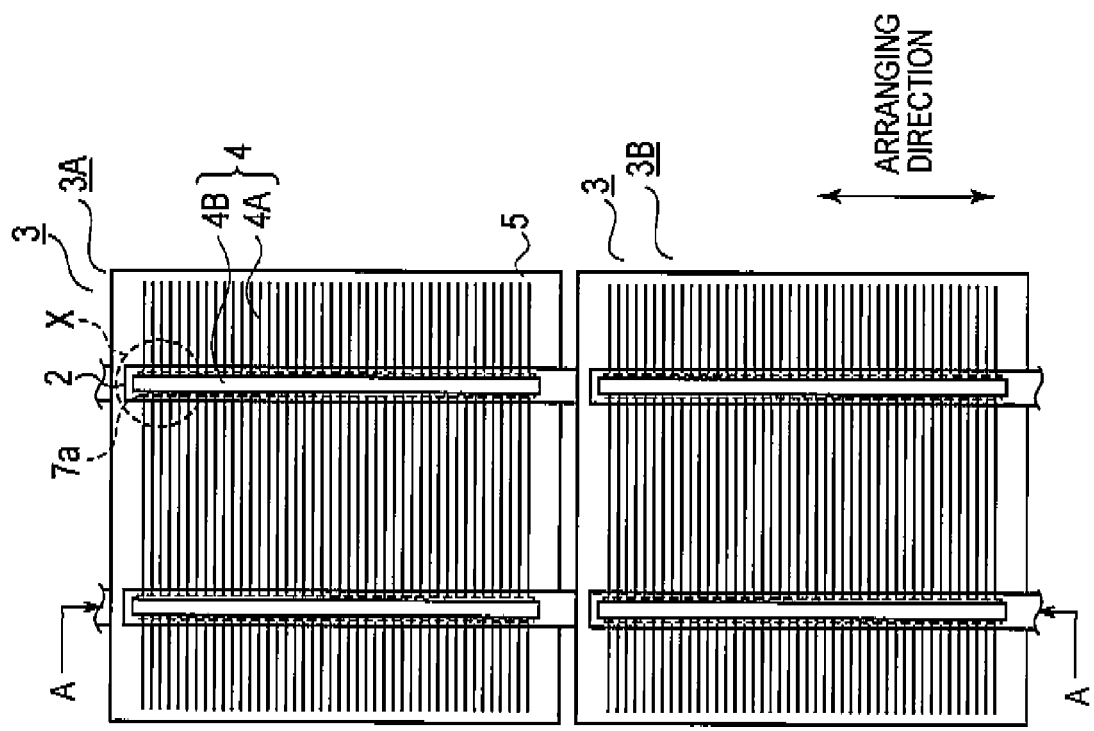

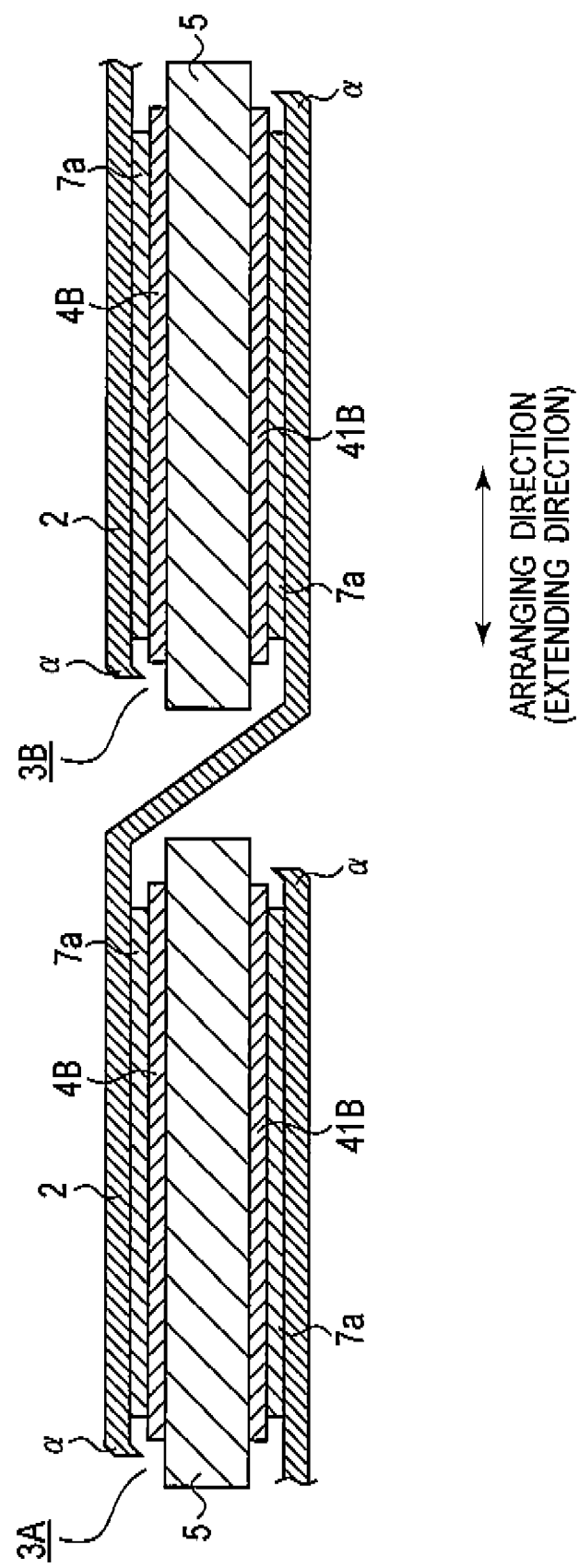

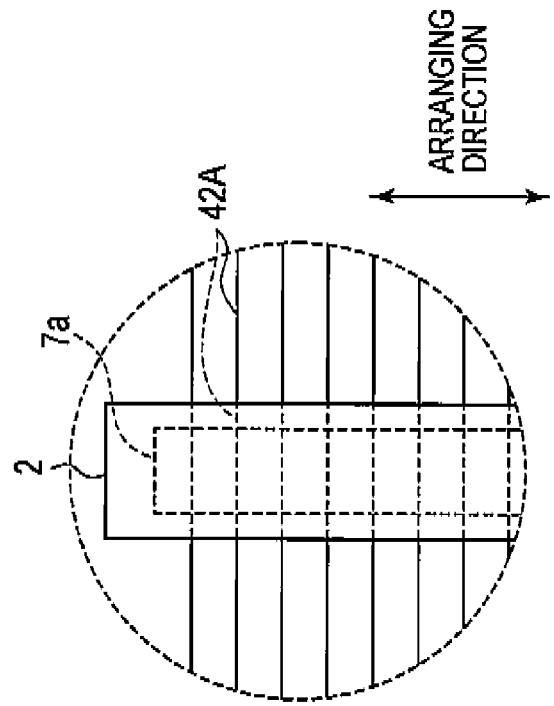
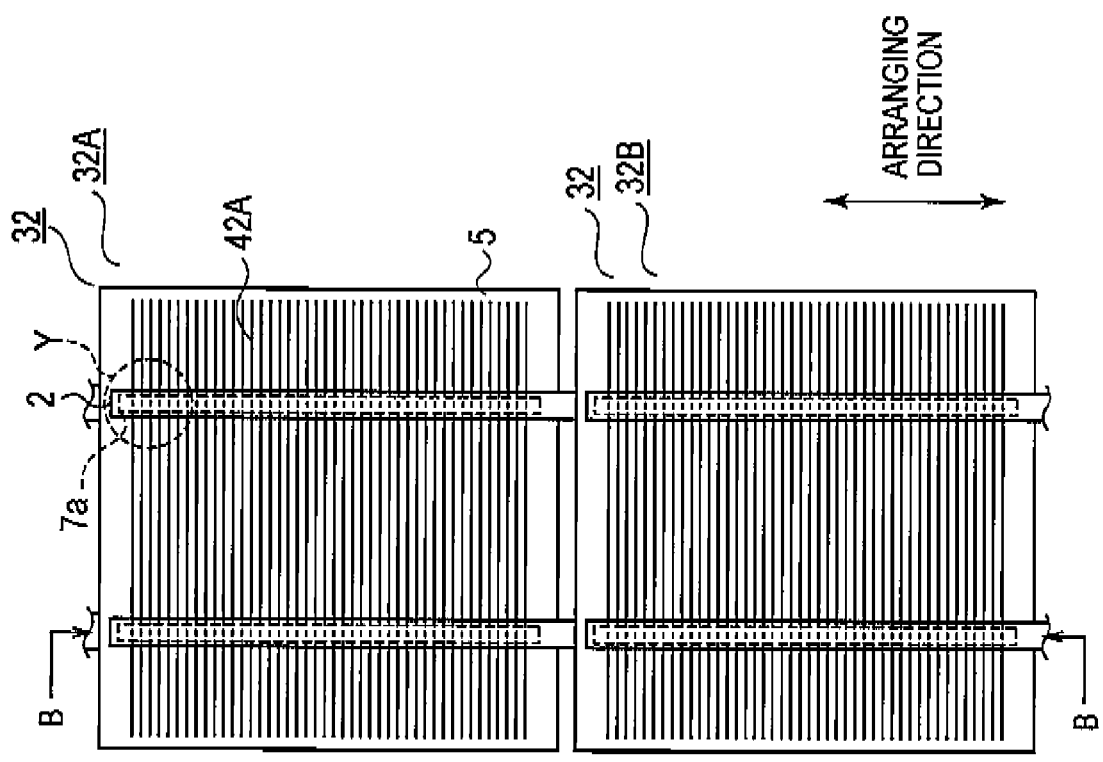

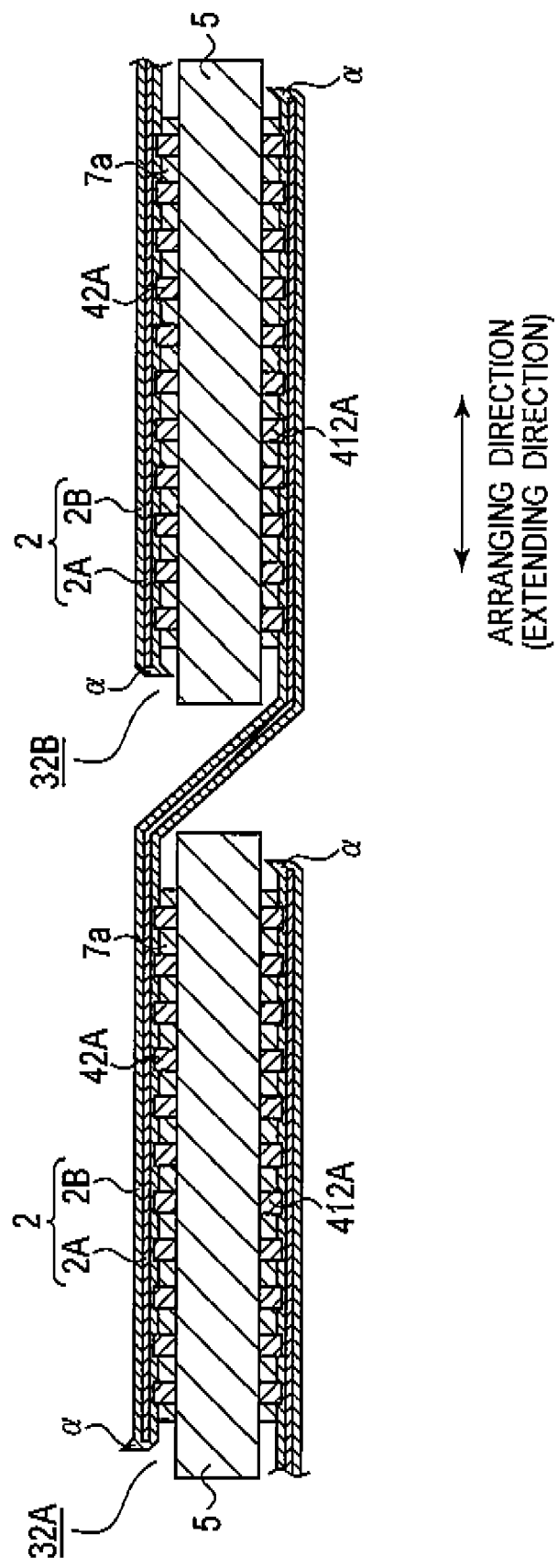

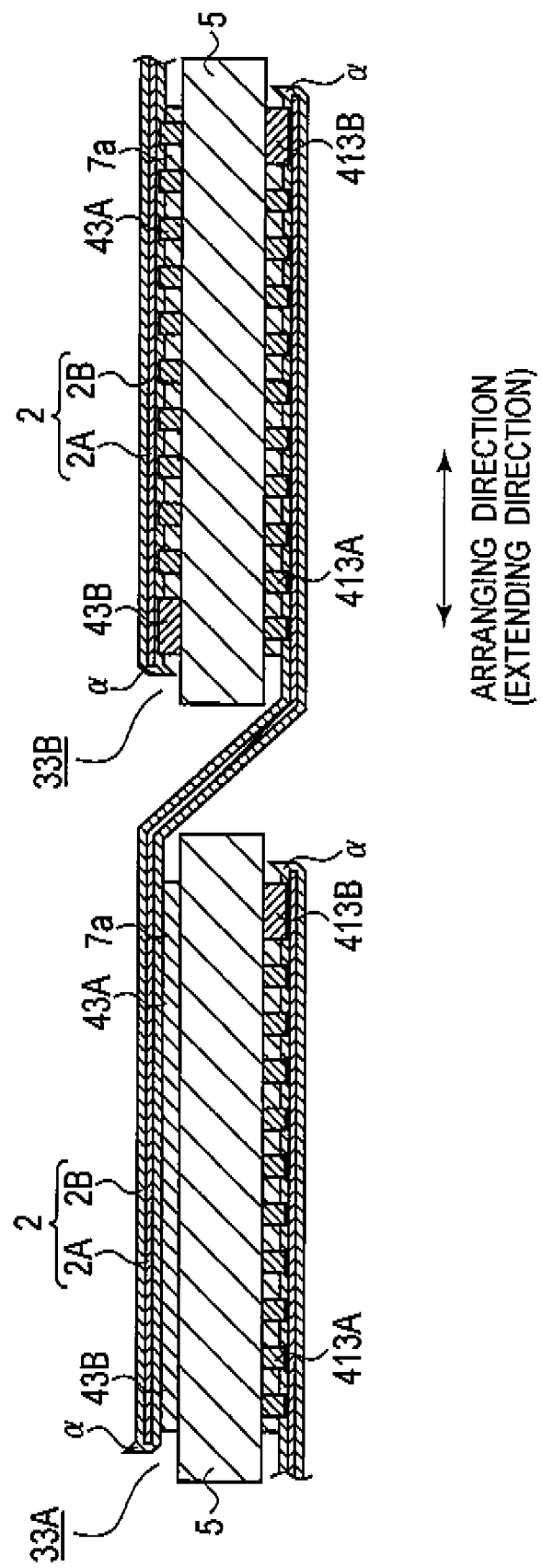

SOLAR CELL MODULE AND METHOD OF MANUFACTURING THE SAME

CROSS REFERENCE TO RELATED APPLICATIONS

This application is based upon and claims the benefit of priority from prior Japanese Patent Application No. 2008-21125, filed on Jan. 31, 2008, and No. 2008-321530, filed on Dec. 17, 2008; the entire contents of which are incorporated herein by reference.

BACKGROUND OF THE INVENTION

1. Field of the Invention

The present invention relates to a solar cell module having a plurality of solar cells electrically connected to each other by wiring members, and a method of manufacturing such a solar cell module.

2. Description of the Related Art

As shown in a conceptual sectional view of FIG. 1, a solar cell module 1 has such a configuration that a plurality of solar cells 3, 3, . . . electrically connected to each other by wiring members 2 are sealed between a front surface protection member 107 and a back surface protection member 108 in a sealing member 109. The wiring members 2 and the plurality of solar cells 3 are bonded with bonding layers 7a formed of solder.

Meanwhile, the wiring members 2 are prepared in the form of a continuum wound around a reel in advance when they are manufactured. In a known method, the continuum is cut into the wiring members 2 each having a predetermined length, and then the wiring members 2 are sequentially bonded to electrode surfaces of the plurality of solar cells 3 (refer to Japanese Patent Application Publication No. Hei 10-93120, for example).

SUMMARY OF THE INVENTION

In a conventional method of manufacturing a solar cell module, the wiring members 2 are obtained by cutting the continuum every predetermined length, and thus might include deformations or burrs in cut portions.

Conventionally, a whole surface of such a wiring member 2 having a burr or a deformation formed at ends has been bonded to an electrode surface of a solar cell with a bonding layer 7a formed of solder. However, if such a wiring member 2 is used, pressure applied when the wiring member 2 and the solar cell 3 are bonded will locally increase near a burr or a deformed part of the wiring member 2. Then, the locally increased pressure is applied to the solar cell 3 through the bonding layer 7a. Thus, the conventional method has a problem that due to the locally applied excessive pressure, the solar cell becomes vulnerable to such defects as breakage, chipping, cracks and microcracks.

In addition, pressure is also given when the plurality of solar cells 3 bonded to the wiring members 2 is sealed between the front surface protection member 107 and the back surface protection member 108 in the sealing member 109. Then, also in this case, great pressure is locally applied near burrs or deformed parts of the wiring members 2. Thus, the conventional method has another problem that this pressure is applied to the plurality of solar cells 3 through the bonding layers 7a, which makes the solar cells vulnerable to defects such as breakage, chipping, cracks and microcracks.

The conventional method has still another problem that reliability of the solar cell module is degraded due to influence of the defects as described above.

Conventionally, these problems cause decrease in output of the solar cell module, thus possibly leading to a reduction in fabrication yield.

Hence, the present invention has been made in light of the above problems, and an object of the present invention is to provide: a solar cell module with an increased fabrication yield; and a method of manufacturing the solar cell module.

A solar cell module according to the present invention includes: a solar cell having a connecting electrode formed on a surface thereof; a wiring member electrically connected to the connecting electrode; and a bonding layer for bonding the wiring member on the surface of the solar cell. In the solar cell module, the wiring member has a protruding portion extending beyond the bonding layer at an end of the wiring member.

In the solar cell module according to the present invention, a space may be provided between the surface of the solar cell and a surface of the protruding portion facing the surface of the solar cell.

In the solar cell module according to the present invention, an end of the protruding portion may be located inside a peripheral edge of the solar cell.

In the solar cell module according to the present invention, the bonding layer may be conductive, and the wiring member may be electrically connected to the connecting electrode through the bonding layer.

In the solar cell module according to the present invention, the wiring member may be electrically connected to the connecting electrode by direct contact.

In the solar cell module according to the present invention, the wiring member may include a conductive core member and a conductive layer formed on a surface of the core member, and the connecting electrode may be partly embedded in the conductive layer.

In the solar cell module according to the present inventions a plurality of solar cells including the solar call is arranged along an arranging direction, the connecting electrode may be formed on the surface of the solar cell along the direction perpendicular to the arranging direction, and include parts of a plurality of thin line-shaped electrodes arranged parallel to each other, and the wiring member may be placed on the plurality of thin line-shaped electrodes along the arranging direction.

The solar cell module according to the present invention includes a crossing electrode electrically connecting one thin line-shaped electrode and another thin line-shaped electrode adjacent thereto, wherein the one thin line-shaped electrode may be electrically connected to an outermost end area of the wiring member, and the one thin line-shaped electrode and the another thin line-shaped electrode may be included in the plurality of thin line-shaped electrodes of the solar cell.

In the solar cell module according to the present invention, the crossing electrode may be placed so as to overlap with the wiring member.

A method for manufacturing a solar cell module according to the present invention includes: a first step of preparing a long wiring material wound like a roll; a second step of forming a wiring member by cutting the long wiring material into predetermined length; and a third step of bonding the wiring member onto a solar cell with bonding layers. In the third step of the method, the wiring member is bonded onto the solar cell with an end of the wiring member extending beyond the bonding layer.

In the method of manufacturing a solar cell module according to the present invention, in the third step, a space may be provided between the end of the wiring member and the solar cell.

In the method of manufacturing a solar cell module according to the present invention, in the third step, the end of the wiring member may be placed inside a peripheral edge of the solar cell.

In the method of manufacturing a solar cell module according to the present invention, the solar cell may include a connecting electrode formed on a surface thereof, the bonding layers may be conductive, and in the third process, the wiring member may be electrically connected to the connecting electrode through the bonding layer.

In the method of manufacturing a solar cell module according to the present invention, the solar cell may include a connecting electrode formed on a surface thereof, and in the third process, the wiring member may be electrically connected to the connecting electrode by direct contact.

In the method of manufacturing a solar cell module according to the present invention, the wiring member may have a conductive core member and a conductive layer formed on a surface of the core member, and in the third process, the connecting electrode may be partly embedded in the conductive layer.

In the method of manufacturing a solar cell module according to the present invention, the connecting electrode may be formed on the surface of the solar cell along a predetermined direction, and include parts of a plurality of thin line-shaped electrodes arranged parallel to each other, and the wiring member may be placed on the plurality of thin line-shaped electrodes along the direction perpendicular to the predetermined direction.

In the method of manufacturing a solar cell module according to the present invention, the solar cell may include a crossing electrodes electrically connecting one thin line-shaped electrode and another thin line-shaped electrode adjacent thereto, the one thin line-shaped electrode is electrically connected to an outermost end area of the wiring member, the one thin line-shaped electrode and the adjacent thin line-shaped electrode are included in the plurality of thin line-shaped electrodes, and in the third process, the crossing electrode may be placed so as to overlap with the wiring member.

According to the present invention, a solar cell module with improved yield can be provided.

BRIEF DESCRIPTION OF THE DRAWINGS

FIGS. 4A and 4B are views illustrating a connection relationship between solar cells and wiring members of the solar cell module according to the first embodiment.

FIG. 5 is a cross-sectional view illustrating the connection relationship between the solar cells and the wiring members of the solar cell module according to the first embodiment.

FIGS. 8A and 8B are views illustrating a connection relationship between solar cells and wiring members of a solar cell module according to the second embodiment.

FIG. 9 is a cross-sectional view illustrating the connection relationship between the solar cells and the wiring members according to the second embodiment.

FIG. 12 is a cross-sectional view illustrating the connection relationship between the solar cells and the wiring members of the solar cell module according to the third embodiment.

DESCRIPTION OF THE PREFERRED EMBODIMENTS

Figure 1:
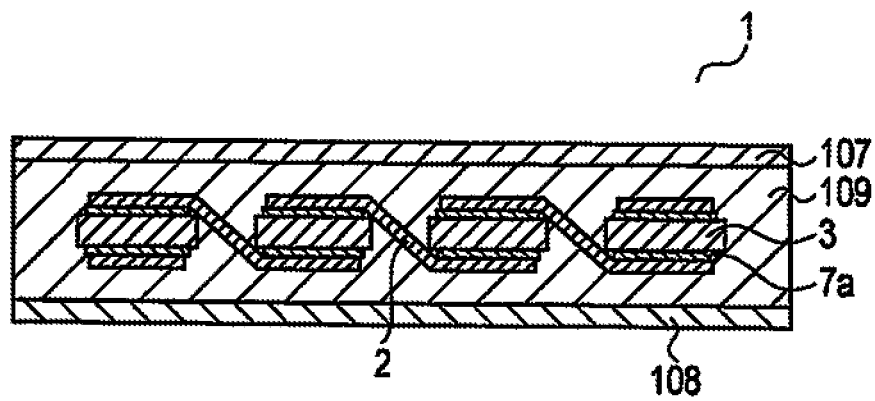
FIG. 1 is a conceptual diagram of a conventional solar cell module.

Embodiments of the present invention will be described hereinafter with reference to the drawings. In the following descriptions of the drawings, the same or similar reference numerals are given to the same or similar elements. It should be noted, however, that the drawings are schematic and the dimensional proportions and the like differ from their actual values. Hence, specific dimensions and the like should be determined by considering the following description. It is also needless to say that dimensional relationships and dimensional proportions may be different from one drawing to another in some parts.

(First Embodiment)

First, a solar cell module 1 according to a first embodiment of the present invention will be described with reference to FIGS. 2 to 5.

(Configuration of Solar Cell Module)

Figure 2:
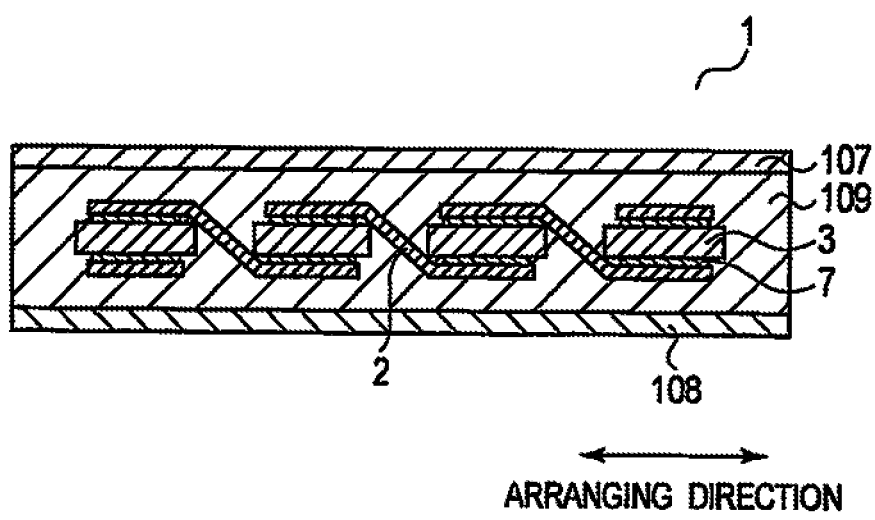
FIG. 2 is a conceptual diagram of a solar cell module according to a first embodiment.

FIG. 2 is a conceptual cross-sectional view showing a configuration of the solar cell module 1 according to this embodiment. The solar cell module 1 includes a plurality of solar cells 3, 3, . . . electrically connected to each other by wiring members 2, a front surface protection member 107, a sealing member 109, and a back surface protection member 108. The plurality of solar cells 3, 3, . . . is arranged in a arranging direction.

The wiring members 2 are made of a metal material such as copper. The surface of the wiring members 2 may be the metal material exposed thereon; alternatively, the surface of the wiring members 2 may be covered by a conductive material layer. The wiring members 2 are wound around a reel in advance, and those cut every predetermined length are used as appropriate, according to the size, thickness or the like of the plurality of solar cells 3. Then, each of the wiring members 2 is bonded to a surface of each of the plurality of solar cells 3 by bonding layer 7*a*. A connection relationship between the plurality of solar cells 3 and the wiring members 2 will be described later.

The front surface protection member 107 is bonded to the light receiving surface of the plurality of solar cells 3 by a sealing member 109 having translucency. The front surface protection member 107 is formed of a translucent material such as glass or translucent plastics. In addition, the back surface protection member 108 is bonded to the back surface of the plurality of solar cells 3 by the sealing member 109. The back surface protection member 108 is formed of a resin film such as PET, a laminated film having such a structure that an Al foil is sandwiched by resin films, or the like.

The sealing member 109 is a translucent resin such as EVA, PVB or the like and is also capable of sealing the solar cell 3. Further, a terminal box for taking out power is provided on the back surface of the back surface protection member 108, for example, although not shown. In addition, a frame body is attached to the peripheral edge of the solar cell module, as necessary.

When such a solar cell module 1 is manufactured, first, the front surface protection member 107, the sealing member 109, the plurality of solar cells 3, the sealing member 109, and the back surface protection member 108 are sequentially stacked to form a laminated body. Then, the laminated body is heated while pressure being applied thereto from top and bottom, to produce a solar cell module 1.

(Structure of Solar Cell)

Figure 3A:
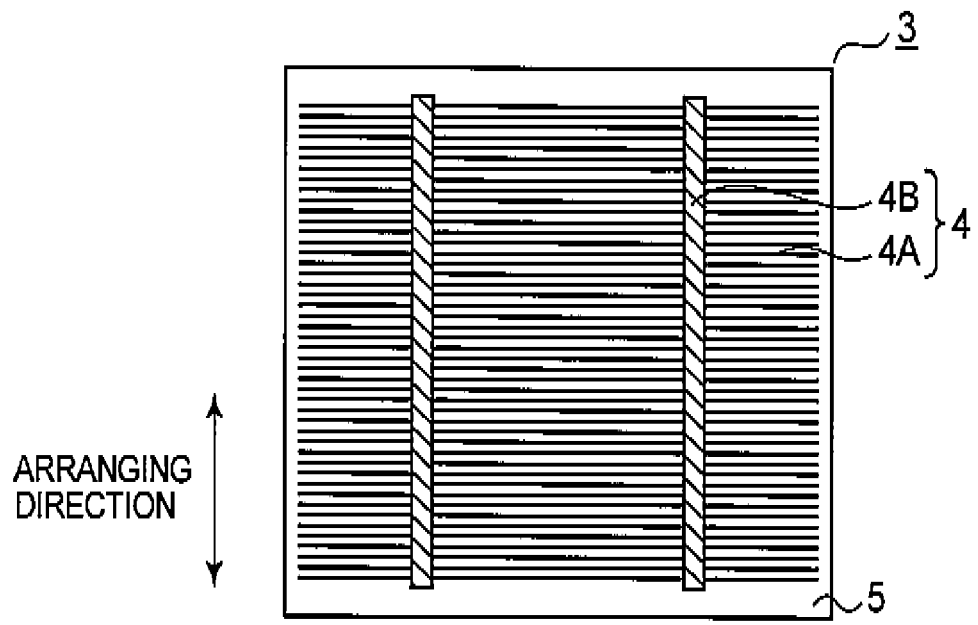
FIGS. 3A and 3B are plane views of a solar cell according to the first embodiment.
Figure 3B:
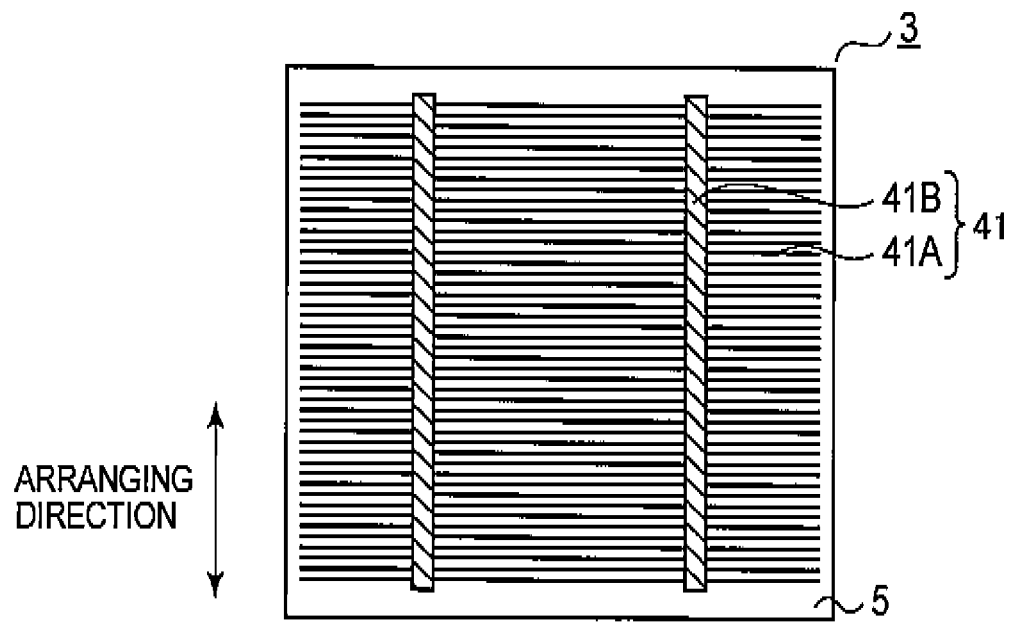

FIG. 3A is a plane view of the solar cell 3 according to this embodiment viewed from the light receiving surface side, and FIG. 3B is a plane view viewed from the back surface side. As shown in FIG. 3A and FIG. 3B, the solar cell 3 has a photoelectric conversion part 5, and collecting electrodes 4 and 41 placed, respectively, on the light receiving surface and the back surface of this photoelectric conversion part 5. The photoelectric conversion part 5 includes a semiconductor wafer of one conductive type that functions as a substrate and includes a semiconductor junction, such as a pn junction or a pin junction forming an electric field for separating photogenerated carriers. As a semiconductor wafer, a crystal wafer such as a single crystal silicon wafer or a polycrystalline silicon wafer, a compound semiconductor wafer such as GaAs, or a semiconductor wafer formed of other well-known semiconductor materials can be used. In addition, as a material forming a semiconductor junction between the semiconductor wafers as described above, a crystal semiconductor, an amorphous semiconductor, a compound semiconductor, or other well-known semiconductor materials can be used.

As shown in the plane view of FIG. 3A, the collecting electrodes 4 formed on the light receiving surface of the photoelectric conversion part 5 includes a plurality of thin line-shaped electrodes 4A, 4A, . . . that collect carriers of electrons or holes from the photoelectric conversion part 5, and the connecting electrodes 4B and 4B that function as bus bar electrodes collecting the carriers from the thin line-shaped electrodes 4A, 4A, . . . . In addition, the wiring members 2 are connected to the connecting electrodes 4B and 4B. Additionally, the thin line-shaped electrodes 4A extend in a direction perpendicular to the arranging direction of the plurality of solar cells 3, and are arranged substantially parallel to each other.

FIG. 3B is a plane view of the solar cell viewed from the back surface side. The collecting electrode 41 formed on the back surface of the photoelectric conversion part 5 includes a plurality of thin line-shaped electrodes 41A, 41A, . . . that collect carriers of electrons or holes from the photoelectric conversion part 5, and the connecting electrodes 41B and 41B that function as bus bar electrodes collecting the carriers from the thin line-shaped electrodes 41A, 41A . . . . In addition, the wiring members 2 are connected to the connecting electrodes 41B and 41B. Additionally, the thin line-shaped electrodes 41A extend in the direction perpendicular to the arranging direction of the plurality of solar cells 3, and are arranged substantially parallel to each other. Note that, the collecting electrodes 41 in the back surface side may have various configurations not limited to this. For example, conductive material is formed on the whole back surface to form the collecting electrode.

The collecting electrodes 4 and 41 are formed of, for example, a thermosetting conductive paste that includes epoxy resin as a binder and conducting particles as a filler. In addition, in the case of a single crystal silicon solar cell, a polycrystalline silicon solar cell, or the like, the configuration is not limited to this, and a sintering paste formed of metallic powder of silver, aluminum, or the like, glass frits, organic vehicles, and the like may be used. Alternatively, the collecting electrodes may also be formed of a general metal material such as silver, aluminum.

(Bonding of Wiring Members)

FIG. 4A is a view of solar cells viewed from the light receiving surface side for illustrating a connection relationship of connecting electrodes 4B, the bonding layers 7a, and the wiring members 2. FIG. 4B is an enlarged view of the main part in the area X surrounded by the dotted line in FIG. 4A. FIG. 5 is a cross-sectional view taken along surface A-A shown in FIG. 4A.

As shown in FIGS. 4A and 4B, adjacent solar cells 3 and 3 are electrically connected to each other by the wiring members 2. The wiring members 2 are placed so as to extend along the arranging direction of the plurality of solar cells 3. Now, among the plurality of solar cells 3, one of the adjacent solar cells 3 is referred to as a first solar cell 3A, while the other as a second solar cell 3B.

As shown in FIGS. 4A and 4B and FIG. 5, the wiring member 2 connecting the first and the second solar cells 3A and 3B is bonded to the surface of the connecting electrode 4B formed on the light receiving surface of the first solar cell 3A and to the surface of the connecting electrode 41B formed on the back surface of the second solar cell 3B, by the bonding layers 7a. Thus, the wiring member 2, the connecting electrode 42 of the first solar cell 3A, and the connecting electrode 41B of the second solar cell 3B are electrically connected. At this time, in this embodiment, the ends of the wiring member 2 extend beyond the bonding layers 7a in extending direction (the arranging direction). With this, the wiring member 2 has at the ends thereof extending parts α that extend beyond the bonding layers 7a. Consequently, deformations and burrs formed at the ends of the wiring 2 are in the extending parts α. A surface of the extending part α facing the surface of the solar cell 3 is spaced from the surface of the solar cell 3, and thus a space is provided therebetween.

The bonding layer 7a is formed of a bonding material. As the bonding material, fusible metal material such as solder, or an electrically conductive bonding material such as a conductive resin bonding material can be used. Alternatively, direct electrical connection may be provided by bringing the wiring member 2 in direct contact with the connecting electrodes 4B and 41B, while mechanical connection may be provided by the bonding layers 7a. In this case, an insulating bonding material may be used in place of the electrically conductive bonding material.

In addition, when the bonding layer 7a used herein is opaque, it is preferable to form the bonding layer 7a inside the wiring member 2 in plane view.

(Method of Manufacturing Solar Cell Module)

A method of manufacturing a solar cell module according to this embodiment will be described hereinafter with reference to FIG. 6.

Figure 6A:
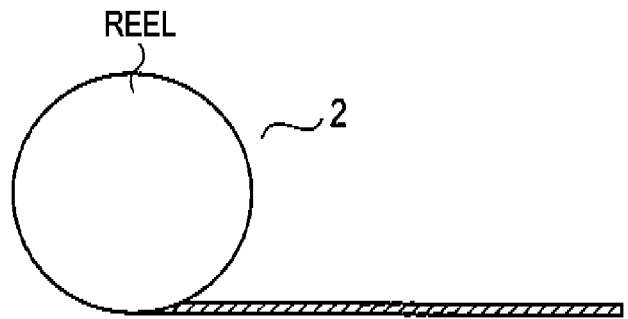
FIGS. 6A to 6C are diagrams illustrating manufacturing steps of the solar cell module according to the first embodiment.

First, in a first step shown in FIG. 6A, a long wiring material 2 that is wound like a roll is prepared. A metal material such as copper is used herein as the wiring member 2.

Figure 6B:
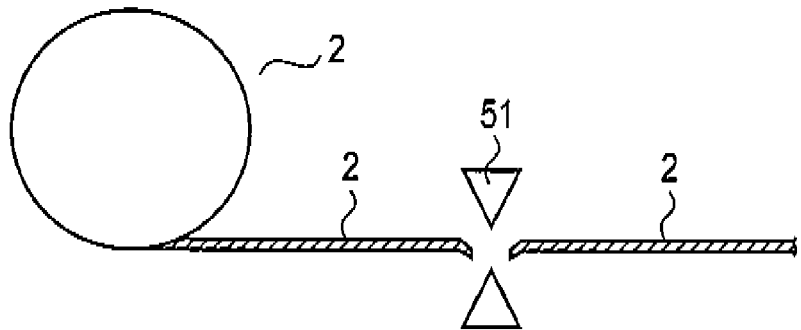

Next, in a second step shown in FIG. 6B, the long wiring material 2 wound like a roll is cut every predetermined length. At this time, deformations or burrs are formed in each end, which is a cut portion, of the wiring member 2. The wiring member 2 may be cut by a cutting method such as cutting from the top and the bottom thereof by a cutter 51, for example. Then, in the wiring member 2, bent parts are formed in accordance with a shape of the solar cell 3 or the like.

Figure 6C:
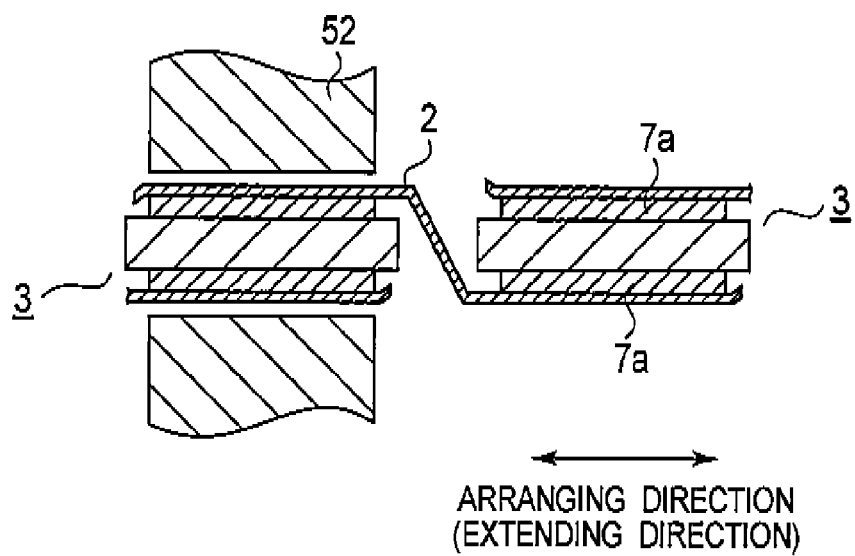

Next, in a third step shown in FIG. 6C, an electrically conductive bonding material is applied onto each of the connecting electrodes 4B and 41B, and then the wiring member 2 is placed on the electrically conductive bonding material. As the electrically conductive bonding material, a solder or a conductive resin bonding material can be used.

Then, the wiring member 2 is placed so that each of the ends of the wiring member 2 in the extending direction extend beyond the bonding layer. The degree of this extending part is determined by considering burrs and deformations of the wiring member 2. Then, after the wiring member 2 is placed, the wiring member 2 is bonded to the solar cell 3 by the bonding layer 7a, by pressure bonding the wiring member 2 while heating the wiring member 2 by a heater 52. Then, the wiring member 2 is bonded so that the end thereof extends beyond the bonding layer 7a. As a result, the wiring member 2 has at an end thereof the extending part α that extends beyond the bonding layer 7a. Accordingly, deformations and burrs formed in the end of the wiring member 2 are in the extending part α. The extending part α of the wiring member 2 is spaced from the solar cell 3, providing a space therebetween.

(Operation and Effect)

In the solar cell module 1 according to this embodiment, the wiring member 2 is placed so that the end in the extending direction has the extending part α extending beyond the bonding layer 7a. Burrs or deformations are in the extending part α of the wiring member 2 and a flat part of the wiring member 2 is bonded to the solar cell 3. Then, a surface of the extending part α of the wiring member 2 facing a surface of the solar cell 3, the surface of the extending part α having burrs and deformations resulting from cutting of the wiring member 2, is spaced from the solar cells 3A and 3B, and thus a space is provided therebetween. Thus, pressure between the wiring member 2 and the solar cells 3A and 3B is dispersedly applied to the substantially flat parts of the wiring member 2, and then applied to the solar cells 3A and 3B through the bonding layers 7a. In addition, since the space is provided between the extending part α of the wiring member 2 and the solar cell 3, pressure applied to the extending part α during bonding can be released by deformation of the extending part α to the space side. Consequently, occurrence of defects such as breakage, chipping, cracks, and microcracks, of the solar cell due to the locally applied great force is prevented. In addition, since the solar cells 3A and 3B and wiring member 2 are bonded by the bonding layers 7a placed on the substantially flat parts of the wiring member 2, occurrence of contact failure is also prevented.

Further, the solar cell module 1 is manufactured by sequentially stacking the front surface protection member 107, the sealing member 109, the plurality of solar cells 3 connected by the wiring members 2, the sealing member 109, and the back surface protection member 108, and then heating the laminated body while applying pressure thereon from the top and bottom.

At this time, the wiring members 2 connecting the plurality of solar cells 3 is arranged so that the ends in the extending direction of each of the wiring members have the extending parts α extending beyond the bonding layers 7a. Burrs or deformations are in the extending parts α of the wiring members 2. The plurality of solar cells 3 is bonded on the flat parts of the wiring members 2. Accordingly, when the solar cell module 1 is manufactured, pressure is applied substantially uniformly to the plurality of solar cells 3 through the flat parts of the wiring members 2. Thus, occurrence of defects such as breakage, chipping, cracks, and microcracks of the solar cells can be prevented. As a result, this embodiment makes it possible to control reduction in output and to provide a solar cell module with an improved fabrication yield. Additionally, reliability of the solar cell module can be improved, because reduction in output due to the defects described above can be prevented.

Although the metal material such as copper is used as the wiring members 2 in this embodiment, the material is not limited to this. A metal material such as a copper with the surface thereof coated by solder may also be used. In such a case, the step of applying a bonding material as described in the third step can be omitted, and in the step of heating the wiring member 2, the center part of the wiring member 2 may be heated to melt the solder coated around the center part so that the solder at the end of the wiring member 2 will have a temperature less than the melting-point of the solder. Such operation enables the wiring member 2 to be bonded to the surfaces of the connecting electrodes 4B and 41B, so that the wiring member 2 has at the ends thereof the extending parts α extending beyond the bonding layers 7a.

In addition, each end of the extending parts α of the wiring member 2 is located inside the peripheral edge of the solar cell 3. If the end of the extending part α extends beyond the peripheral edge of the solar cell 3, a deformed end of the extending part α may be brought into contact with the side surface of the solar cell 3 and be sealed as it is, in modularization. Then, if the end of the extending part α of the wiring member 2 is in contact with the side surface of the solar cell 3 in this way, an undesired current leak or a short circuit may occur between the wiring member 2 and the solar cell 3 in some cases. Thus, it is preferable that the end of the extending part α of the wiring member 2 be located inside the peripheral edge of the solar cell 3. Such a configuration makes it possible to prevent undesired current leak or short circuit from occurring between the wiring member 2 and the solar cell 3.

(Second Embodiment)

A second embodiment of the present invention will be described with reference to FIGS. 7A and 7B, FIGS. 8A and 8B and FIG. 9. In the following descriptions, descriptions of the same or similar parts as those in the first embodiment described above will be omitted.

(Solar Cells)

Figure 7A:
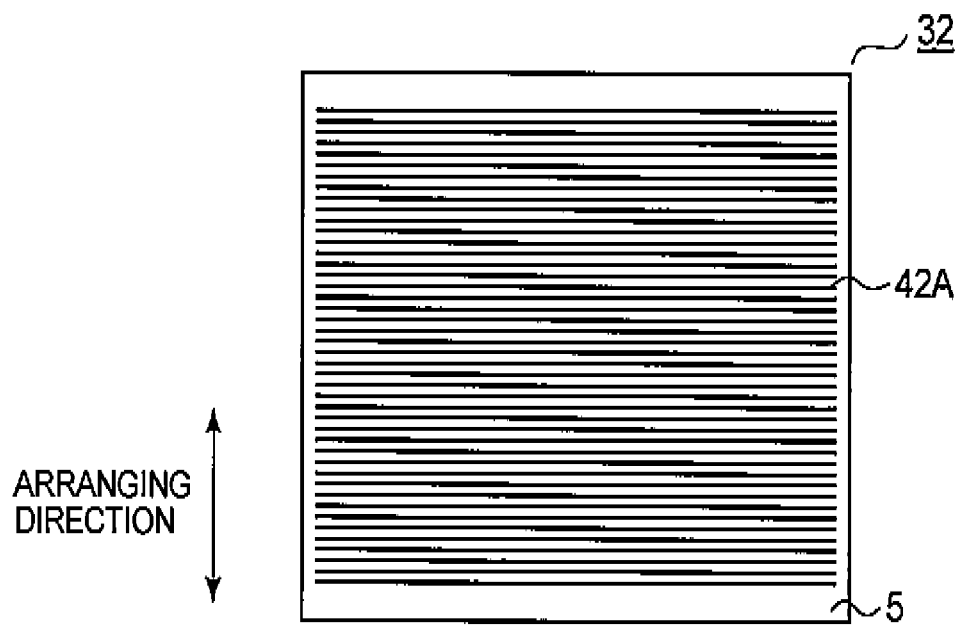
FIGS. 7A and 7B are plane views of a solar cell according to a second embodiment.
Figure 7B:
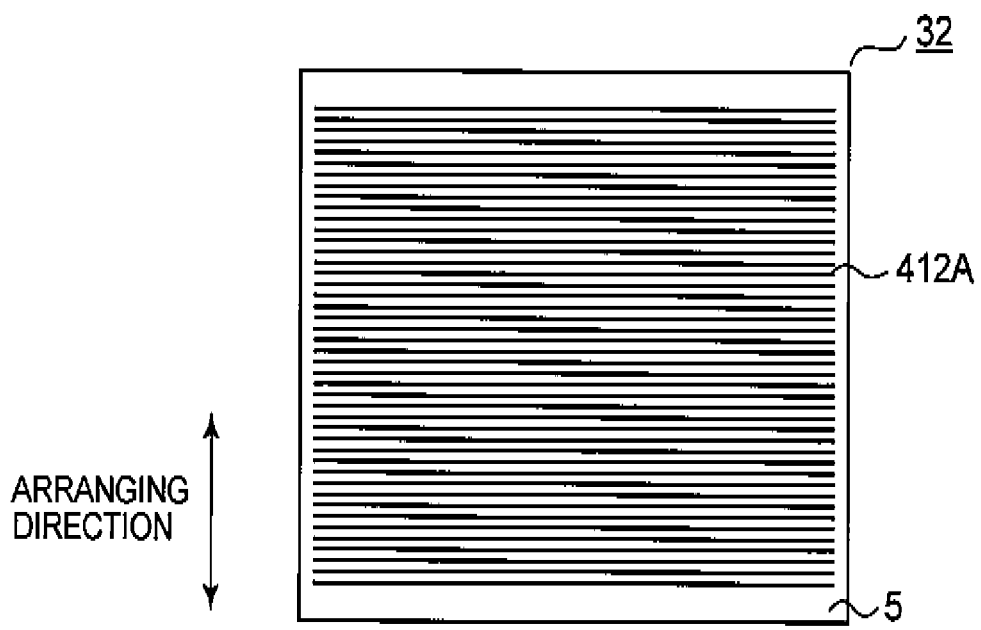

FIG. 7A and 7B are plane views of a solar cell 32 according to a second embodiment viewed from a light receiving surface side and from the back surface side, respectively. As shown in FIG. 7A, only thin line-shaped electrodes 42A each collecting carriers are formed on the light receiving surface of the solar cell 32. In addition, as shown in FIG. 7B, only thin line-shaped electrodes 412A each collecting carriers are formed on the back surface of the solar cell 32. In addition, parts of the thin line-shaped electrodes 42A and 412A also functions as a connecting electrode for making an electrical connection with wiring member 2. Additionally, the thin line-shaped electrodes 42A and 412A extend in the direction perpendicular to the arranging direction of the plurality of solar cells 32, and are arranged substantially parallel to each other. The thin line-shaped electrodes 412A on the back surface side is not limited to this but may have various configurations. For example, a conductive material may be placed on the whole back surface to form a collecting electrode 412, or the collecting electrode 412 may have similar configuration to that of the first embodiment.

(Bonding of Wiring Members)

FIG. 8A is a view of the solar cells viewed from the light receiving surface side for illustrating a connection relationship of the thin line-shaped electrodes 42A, the bonding layers 7a, and the wiring members 2. FIG. 8B is an enlarged view of the main part of the solar cell in the area Y surrounded by the dotted line in FIG. 8A. FIG. 9 is a cross-sectional view taken along the surface B-B shown in FIG. 8A.

As shown in FIG. 8, the plurality of solar cells 32 is electrically connected to each other by wiring members 2. Each wiring members 2 is placed on a plurality of thin line-shaped electrodes 42A and 412A so as to extend in the arranging direction of the plurality of solar cells 32. Now, among the plurality of solar cells 32, one of the adjacent solar cells 32 is referred to as a first solar cell 32A, and the other a second solar cell 32B.

In this embodiment, each wiring member 2 has a core member 2A formed of a metal material such as a copper wire, and a conductive layer 2B such as solder coated on the surface of core member 2A. Then, since outer edges of the thin line-shaped electrodes 42A and 412A are embedded in the conductive layers 2B, the thin line-shaped electrodes 42A and 412A and the wiring member 2 are electrically connected. In addition, each wiring member 2 is connected to the surface of the solar cell 32 by the bonding layers 7a. As described above, in this embodiment, electrical connection is provided by the direct contact of the thin line-shaped electrodes 42A and 412A with the wiring members 2. Thus, in this embodiment, a bonding material forming the bonding layer 7a is not limited to an electrically conductive bonding material, but an insulting bonding material such as a resin bonding material may be used.

Then, as shown in FIGS. 8A and 8B and FIG. 9, in this embodiment, each wiring member 2 is bonded so that the ends thereof in the extending direction (the arranging direction) will extend beyond the bonding layers 7a. Accordingly, each wiring member 2 has at the ends thereof extending parts α extending beyond the bonding layers 7a At this time, deformations and burrs formed in the ends of the wiring member 2 are in the extending parts α. Each extending part α is spaced from the surface of the solar cell 32, which provides a space therebetween.

(Method of Manufacturing Solar Cell Module according to Second Embodiment)

A method of manufacturing a solar cell module according to this embodiment will be described hereinafter.

First and second steps are the same as those of the method of manufacturing a solar cell module according to the first embodiment.

In a third step, a bonding material is applied onto the solar cells 32A and 32B, and then each wiring member 2 that was cut and has a bent part is placed on the solar cells 32A and 32B. Where to place the wiring member 2 may be determined by considering length, width, thickness, and the like of the thin line-shaped electrodes 42A or 412A.

At this time, the wiring member 2 is placed so that the ends of the wiring member 2 in the arranging direction will extend beyond the bonding layers. The degree of this extension is determined by considering burrs, deformation, and the like of the wiring member 2. After the wiring member 2 is placed, the wiring member 2 is bonded to the solar cell 32 by the bonding layer 7a, by pressure bonding the wiring member 2 while heating the wiring member 2 by the heater 52. At this time, pressure is applied to the wiring member 2 so that the thin line-shaped electrodes 42A and 412A may be embedded in the conductive layers 2B. After this bonding, the wiring member 2 is bonded so that the ends thereof will extend beyond the bonding layers 7a. As a result, the wiring member 2 has at the end thereof extending part α extending beyond the bonding layer 7a. Accordingly, deformations and burrs formed in the end of the wiring member 2 are in the extending part α. The extending part α of the wiring member 2 is spaced from the solar cell 32, providing a space therebetween.

(Operation and Effect)

Also in the solar cell module 1 according to this embodiment, each wiring member 2 is arranged so that the wiring member has at the ends thereof in the arranging direction the extending parts α extending beyond the bonding layers 7a. Burrs and deformation are in the extending parts α of the wiring member 2. The wiring member 2 is bonded to each solar cell 32 by a flat part thereof. Thus, each extending part α of the wiring member 2 having burrs and deformations resulting from cutting of the wiring member 2 is spaced from the solar cell 32, and a space is provided between the extending part α of the wiring member 2 and the solar cell 32. Thus, pressure between the wiring member 2 and the solar cells 32A and 32B is dispersedly applied to the substantially flat parts of the wiring member 2, and then applied to the solar cells 32A and 32B through the bonding layers 7a. In addition, as the space is provided between the extending part α of the wiring member 2 and the solar cells 32A and 32B, pressure applied to the extending part α during bonding can be released by the deformation of the extending part α to the space side. Consequently, occurrence of defects such as breakage, chipping, cracks, and microcracks, of the solar cell due to the locally applied great force is prevented. In addition, since the solar cells 32A and 32B and wiring member 2 are bonded by the bonding layers 7a arranged on the substantially flat parts of the wiring member 2, occurrence of contact failure is also prevented.

Further, the solar cell module 1 is manufactured by sequentially stacking the front surface protection member 107, the sealing member 109, the plurality of solar cells 32 connected by the wiring members 2, the sealing member 109, and the back surface protection member 108, and then heating the laminated body while applying pressure thereon from the top and bottom.

At this time, the wiring members 2 connecting the plurality of solar cells 32 are arranged so that the ends in the extending direction of each of the wiring members have the extending parts α extending beyond the bonding layers 7a. Burr and deformations are in the extending parts α of the wiring members 2. The plurality of solar cells 32 is bonded on the flat parts of the wiring member 2. Accordingly, when the solar cell module 1 is manufactured, pressure is applied substantially uniformly to the plurality of solar cells 32 through the flat parts of the wiring members 2. Thus, occurrence of defects such as breakage, chipping, cracks, and microcracks of the solar cells can be prevented. As a result, this embodiment makes it possible to provide a solar cell module with an improved fabrication yield. In addition, reliability of the solar cell module can be improved, because reduction in output of the plurality of solar cells 32 due to the defects described above can be prevented.

(Third Embodiment)

A third embodiment of the present invention will be described with reference to FIGS. 10A and 10B, FIGS. 11A and 11B and FIG. 12. In the following descriptions, descriptions of the same or similar parts as those in the first and second embodiments described above will be omitted.

(Solar Cells)

Figure 10A:
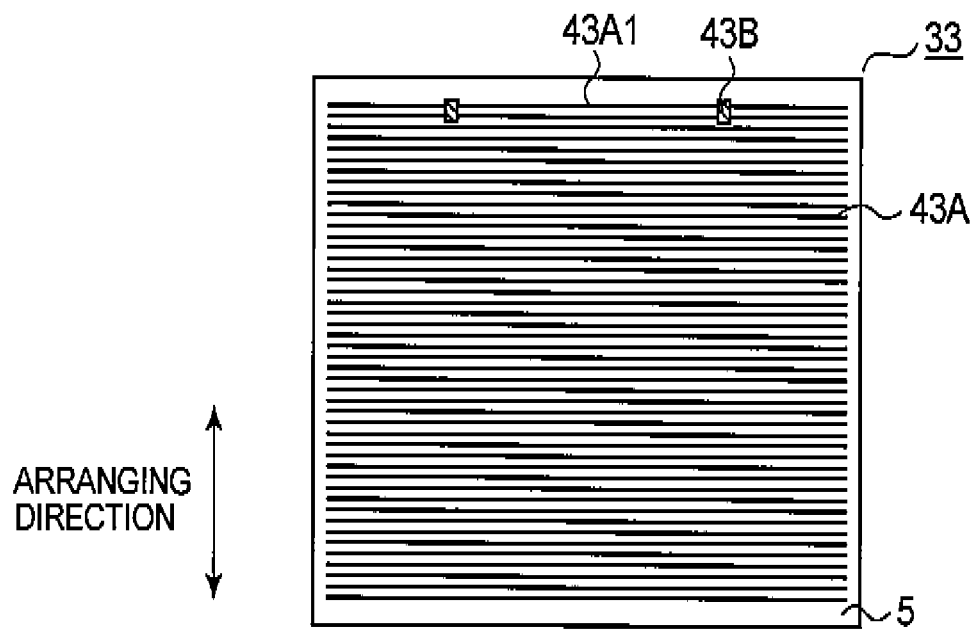
FIGS. 10A and 10B are plane views of a solar cell according to a third embodiment.
Figure 10B:
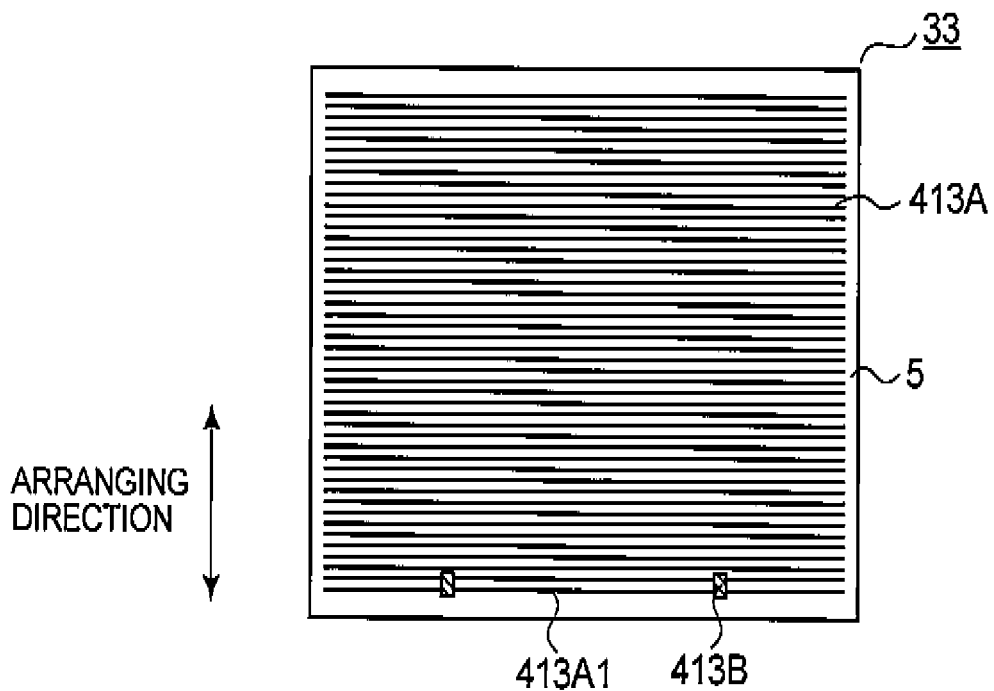

FIG. 10A is a plane view of a solar cell 33 according to this embodiment viewed from the light receiving surface side, and FIG. 10B is a plane view viewed from the back surface side.

This embodiment differs from the second embodiment in that crossing electrodes 43B and 413B are provided so that the electrodes 43B and 413B are electrically connected to a plurality of thin line-shaped electrodes 43A or 413A.

(Bonding of Wiring Members)

Figure 11A:
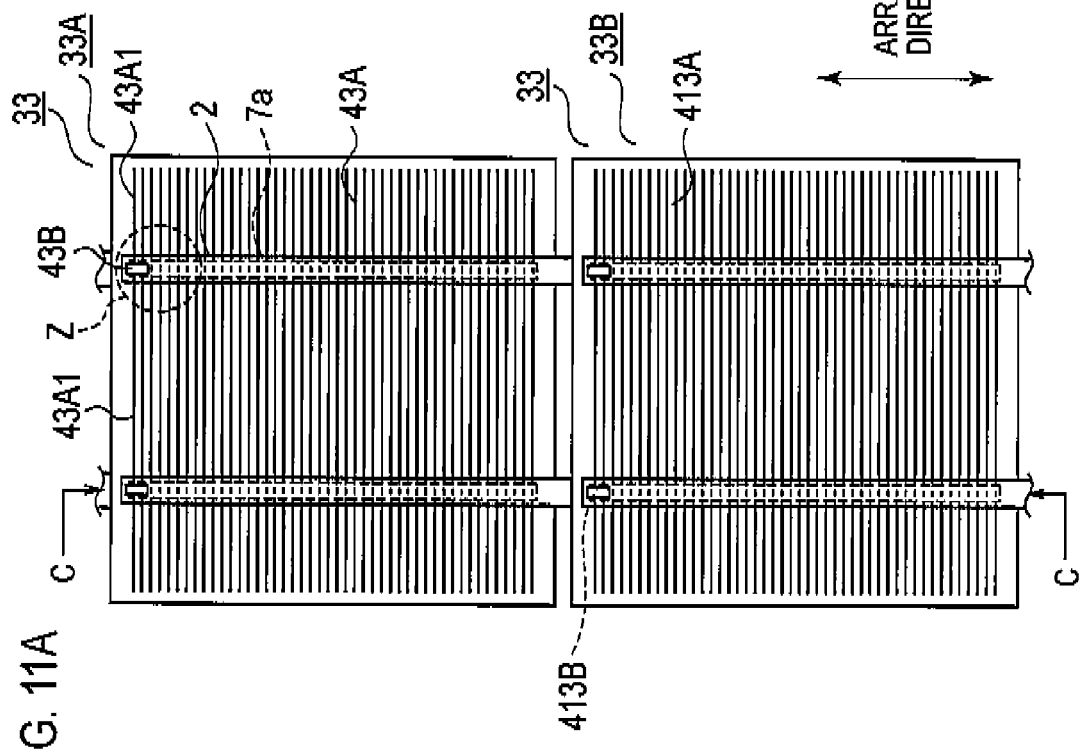
FIG. 11A and 11B are views illustrating a connection relationship between solar cells and wiring members of a solar cell module according to the third embodiment.
Figure 11B:
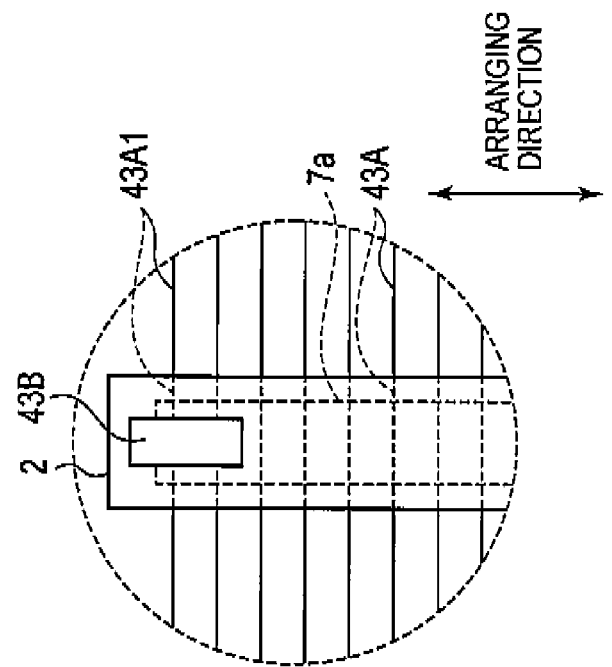

FIG. 11A is a view of the solar cells viewed from the light receiving surface side for illustrating a connection relationship of the crossing electrodes 43B, thin line-shaped electrodes 43A, and the bonding layers 7a. FIG. 11B is an enlarged view of the main part in the area Z surrounded by the dotted line in FIG. 11A. FIG. 12 is a cross-sectional view taken along surface C-C shown in FIG. 10A.

As shown in FIG. 11, each crossing electrode 43B or 413B is placed in a position corresponding to an end of the wiring member 2. The crossing electrode 43B or 413B is provided to electrically connect, among the plurality of thin line-shaped electrodes 43A or 413A, a thin line-shaped electrode 43A1 or 413A1 that is electrically connected to the wiring member 2 at the outermost part on the end side of the wiring member 2, to the thin line-shaped electrode 43A or 413A adjacent thereto. Then parts of thin line-shaped electrodes 43A and 413A, and the crossing electrodes 43B and 413B also function as connecting electrodes for providing electrical connection to the wiring members 2. Widths of these crossing electrodes 43B and 413B are smaller than those of the conductive layers 2B formed on the wiring members 2. Thus, as shown in the cross-sectional view in FIG. 12, since the crossing electrodes 43B and 413B as well as the thin line-shaped electrodes 43A and 413A are contiguously embedded in the conductive layers 2B, the wiring member 2 and the plurality of solar cells 33 are electrically connected. In addition, although the crossing electrode 43B may be provided in a position not overlapping with the wiring member 2, it is preferable that the crossing electrode 43B be placed so as to overlap with the wiring member 2 so that no light receiving area will be reduced.

As described earlier, the end of the extending part α of the wiring member 2 is located inside the peripheral edge of the solar cell 33. Thus, the wiring member 2 is placed inside the solar cell 33, being spaced from the peripheral edge of the solar cell 33. In this case, with the structure of the second embodiment, when direct electrical connection is made between the thin line-shaped electrode 43A1 or 413A1 and the wiring member 2 or 2, the thin line-shaped electrode 43A1 or 413A1 being provided at the closest position to the peripheral edge of the solar cell 33, that is, being provided on the outermost area, there may exist no bonding layer 7a in such a area. In such a case, bonding strength of the wiring member 2 to the solar cell 33 may decrease at the end portion, and the wiring member 2 may peel off from the thin line-shaped electrode 43A1 or 413A1 at the outermost area with longtime use, thus power being reduced. In contrast, according to the this embodiment, since the thin line-shaped electrode 43A1 or 413A1 at the outermost area is electrically connected by the crossing electrode 43B or 413B with the plurality of thin line-shaped electrodes 43A or 413A that is located inside the thin line-shaped electrodes 43A1 or 413A1, there is no reduction in the output of the solar cell.

(Operation and Effect)

This embodiment can achieve the same effect as that of the second embodiment.

In this embodiment, the crossing electrodes 43B and 413B are electrically connected to the thin line-shaped electrode 43A1 or 413A1 at the outermost area. Then, since the crossing electrodes 43B and 413B are embedded in the conductive layers 2B of the wiring member 2, the crossing electrode 43B and 413B are electrically connected to the wiring member 2. Accordingly, power collection from the thin line-shaped electrode 43A1 or 431A at the outermost area can be reliably performed. Thus, reduction in output due to contact failure between the thin line-shaped electrode 43A1 or 413A1 at the outermost area and the wiring member 2 can be prevented, and reliability can be thereby improved.

Additionally, the crossing electrodes 43B and 413B are formed so as to be electrically connected to the thin line-shaped electrodes 43A1 or 413A1 at the outermost area and the plurality of thin line-shaped electrodes 43A or 413A. Thus, it is possible to apply a bonding material inside the thin line-shaped electrode 43A1 or 413A1 at the outermost area. This facilitates formation of the end of the extending part α of the wiring member 2 inside the peripheral edge of the solar cell 33.

(Fourth Embodiment)

A fourth embodiment of the present invention will be described with reference to FIGS. 13A and 13B and FIGS. 14A and 14B. In the following descriptions, descriptions of the same or similar parts as those in the first to third embodiments described above will be omitted.

(Solar Cells)

Figure 13A:
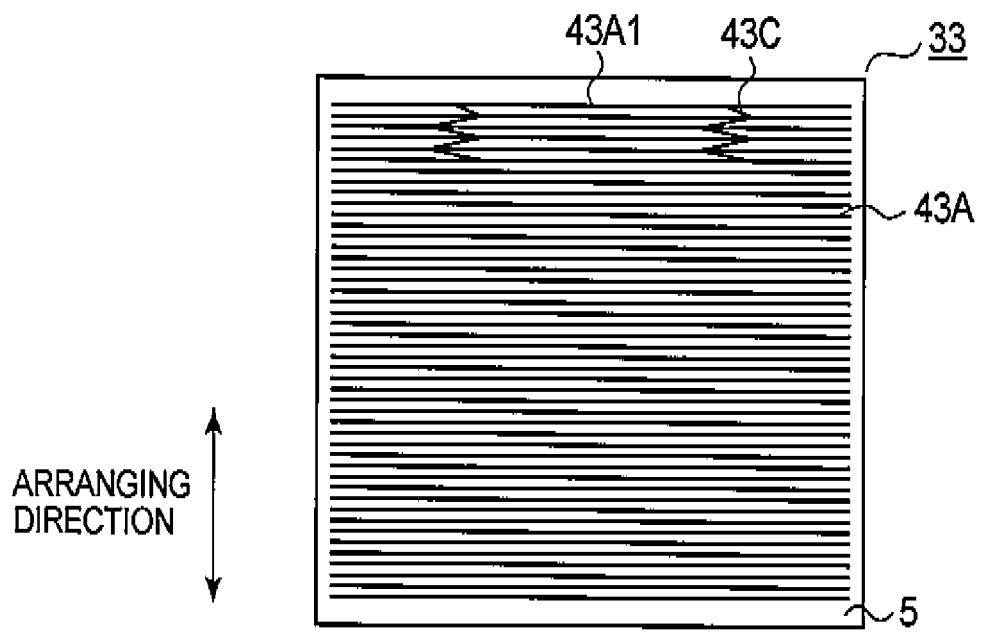
FIGS. 13A and 13B are plane views of a solar cell according to a fourth embodiment.
Figure 13B:
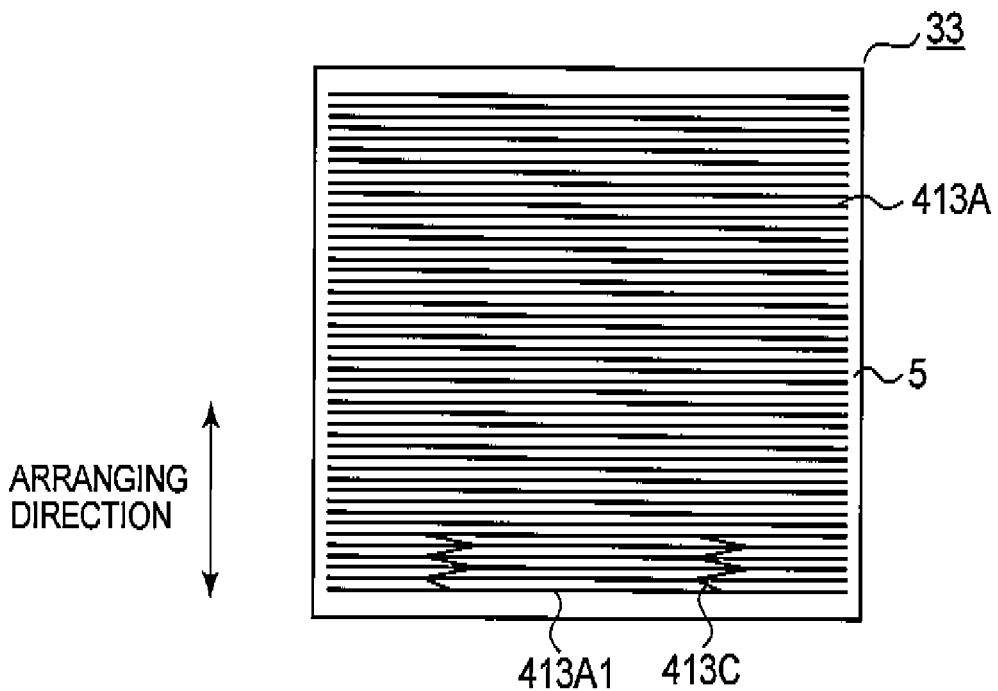

FIG. 13A is a plane view of a solar cell 33 according to this embodiment viewed from the light receiving surface side, and FIG. 13B is a plane view viewed from the back surface side.

This embodiment differs from the third embodiment in that zigzag shaped connection wires 43C and 413C are provided in place of the crossing electrodes 43B and 413B.

(Bonding of Wiring Members)

Figure 14B:
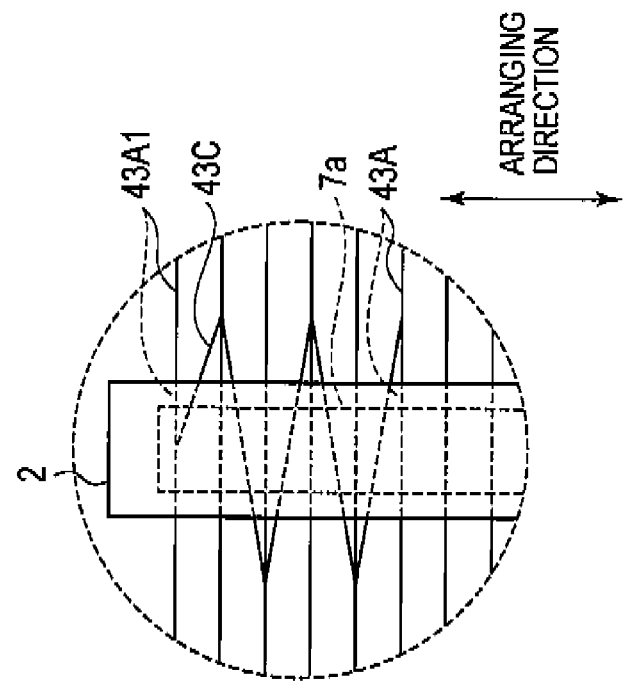
FIGS. 14A and 14B are views illustrating a connection relationship between solar cells and wiring members of a solar cell module according to the fourth embodiment.
Figure 14A:
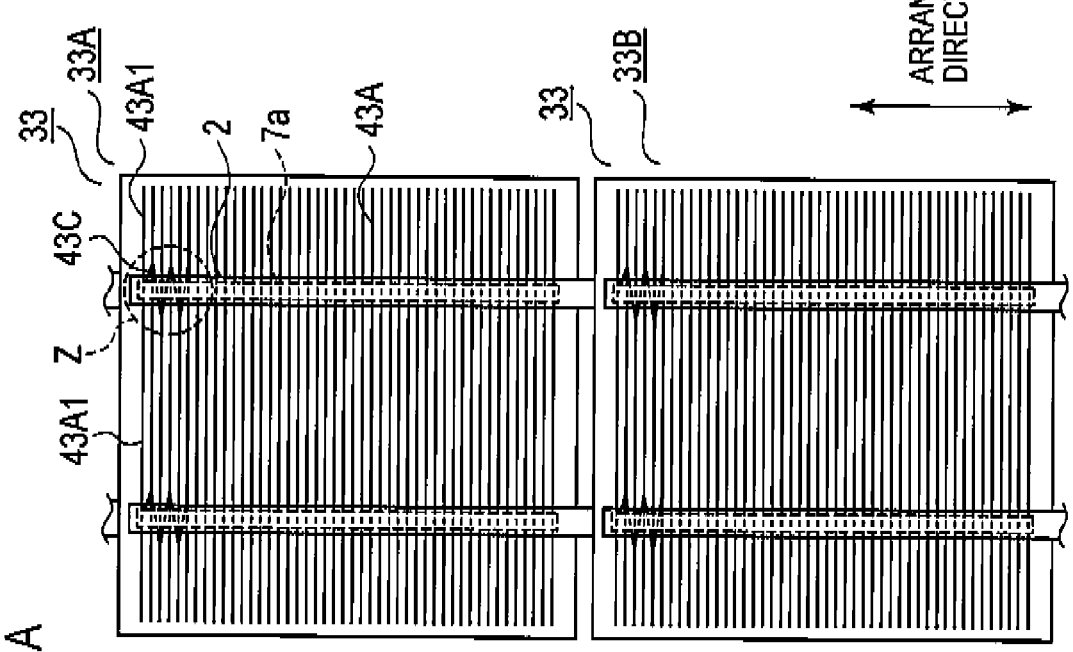
Figure 15A:
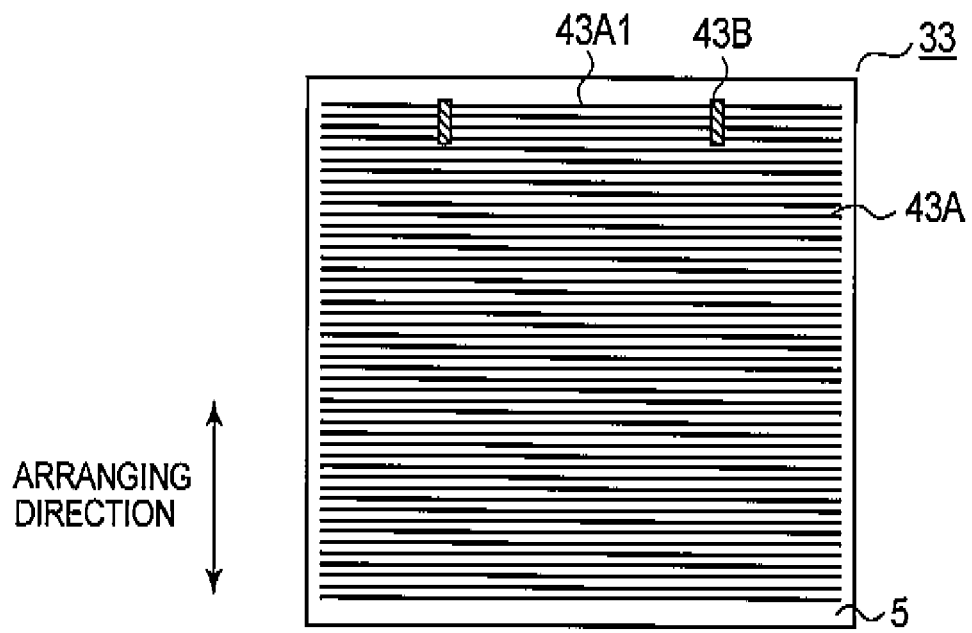
FIGS. 15A and 15B are plane views of a solar cell according to an embodiment.
Figure 15B:
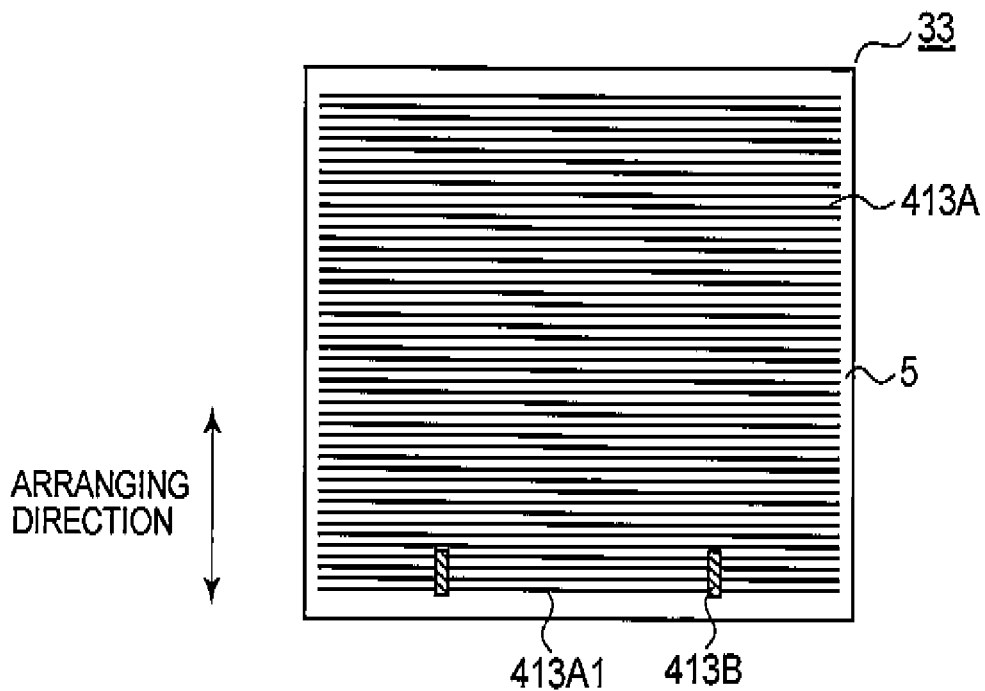

FIG. 14A is a view of the solar cells viewed from the light receiving surface side for illustrating a connection relationship of connection wires 43C, thin line-shaped electrodes 43A, and the bonding layers 7a. FIG. 14B is an enlarged view of the main part in the area Z surrounded by the dotted line in FIG. 14A.

As shown in FIGS. 14A and 14B, the connection wires 43C and 413C are placed in positions corresponding to ends of the wiring members 2. Each connection wire 43C or 413C is provided to electrically connect six thin line-shaped electrodes 43A or 413A, including the thin line-shaped electrode 43A1 or 413A1, among the plurality of thin line-shaped electrodes 43A or 413A. In addition, the connection wires 43C and 413C, and each six thin line-shaped electrodes 43A or 413A serve as connecting electrodes for providing electric connection with the wiring member 2. The widths of the connection wires 43C and 413C are smaller than those of the connecting electrodes and the crossing electrodes in the first to third embodiments. Accordingly, in addition to the thin line-shaped electrodes 43A and 413A, connection wires 43C and 413C embedded in the conductive layers 2B are formed. As a result, the plurality of solar cells 33 and the wiring member 2 are electrically connected.

Here, as shown in FIG. 14, part of each connection wire 43C or 413C may extend beyond the wiring member 2, and be exposed on the light receiving surface of the solar cell 33. However, it is preferable that the exposed part of the connection wire 43C or 413C be made as small as possible, from the viewpoint of suppressing decrease in the light receiving area of the solar cell 33.

As described above, the end of the extending part α of the wiring member 2 is located inside the peripheral edge of the solar cell 33. Accordingly, the wiring member 2 is placed inside the solar cell 33, being spaced from the peripheral edge of the solar cell 33. In this case, with the structure of the second embodiment, when direct electrical connection is made between the thin line-shaped electrode 43A1 or 413A1 and the wiring member 2 or 2, the thin line-shaped electrode 43A1 or 413A1 being provided at the closest position to the peripheral edge of the solar cell 33, that is, being provided on the outermost area, there may exist no bonding layer 7a in such a area. In such a case, bonding strength of the wiring member 2 to the solar cell 33 may decrease at the end portion, and the wiring member 2 may peel off from the thin line-shaped electrode 43A1 or 413A1 at the outermost area with long-time use, thus power being reduced. In contrast, according to the this embodiment, since the thin line-shaped electrodes 43A1 and 413A1 at the outermost area are electrically connected by the connection wire 43C or 413C to the plurality of thin line-shaped electrodes 43A or 413A that is located inside the thin line-shaped electrodes 43A1 or 413A1, there is no reduction in the output of the solar cell.

(Operation and Effect)

This embodiment can achieve the same effect as that of the second embodiment.

In this embodiment, each connection wire 43C or 413C is electrically connected to the thin line-shaped electrode 43A1 or 413A1 at the outermost area. Then, since the connection wire 43C or 413C is embedded into the conductive layer 23 of the wiring member 2, the crossing electrode 43B or 413B is electrically connected to the wiring member 2. Accordingly, power collection from the thin line-shaped electrode 43A1 or 431A at the outermost area can be reliably performed. Thus, reduction in output due to contact failure between the thin line-shaped electrode 43A1 or 413A1 at the outermost area and the wiring member 2 can be prevented, and reliability can be thereby improved.

Additionally, each connection wire 43C or 413C is formed so as to electrically connect the thin line-shaped electrodes 43A1 or 413A1 at the outermost area and the plurality of thin line-shaped electrodes 43A or 413A. Thus, it is possible to apply a bonding material inside the thin line-shaped electrode 43A1 or 413A1 at the outermost area. This facilitates formation of the end of the extending part α of the wiring member 2 inside the peripheral edge of the solar cell 33.

EXAMPLES

The solar cell module according to the present invention will be specifically described hereinafter with Examples.

As Examples of the present invention, the solar cell module according to the first to third embodiments was manufactured as follows. In the following description of the method of production, process is divided into step 1 to step 4.

<Step 1> Formation of a Photoelectric Conversion Part

First, an n-type single crystal silicon substrate having a resistance of approximately 1 Ω·cm, a thickness of approximately 200 μm, and a dimension of approximately 125 mm square was prepared. Next, by using the CVD method, an i-type amorphous silicon layer having a thickness of approximately 5 nm and a p-type amorphous silicon layer having a thickness of approximately 5 nm are formed on the top surface of the n-type single crystal silicon substrate in this order.

Next, by using the CVD method, an i-type amorphous silicon layer having a thickness of approximately 5 nm and an n-type amorphous silicon layer having a thickness of approximately 5 nm were formed on the back surface of the n-type single crystal silicon substrate in this order.

Then, by using the sputtering method, an ITO film having a thickness of approximately 100 nm was formed on each of the p-type amorphous silicon layer and the n-type amorphous silicon layer.

Through this step described above, each of the photoelectric conversion part of the solar cells according to Examples was fabricated.

<Step 2> Formation of a Collecting Electrode

Next, collecting electrodes having the following shapes were formed respectively on the ITO films provided on the light receiving surface side and back side of each of the photoelectric conversion parts by a printing method using an epoxy based thermosetting silver paste.

For samples of Examples 1 to 3 according to the first to third embodiments, respectively, thin line-shaped electrodes having a width of approximately 100 μm and a thickness of approximately 40 μm were formed at a pitch of approximately 2 mm.

In addition, as a sample of Example 1 according to the first embodiment, two bus bar electrodes having a length of approximately 122 mm, a width of approximately 1.0 mm, and a thickness of approximately 50 μm were formed as connecting electrodes 4B and 41B in the direction perpendicular to the thin line-shaped electrodes 4A and 41A. A sample of Example 2 according to the second embodiment has only the thin line-shaped electrodes described above as the connecting electrodes. As a sample of Example 3 according to the third embodiment, each crossing electrode 43B or 413B having a length of approximately 5 mm, a width of approximately 1.0 mm, and a thickness of approximately 50 μm was formed at the position from 1.5 mm to approximately 2.0 mm away from the peripheral edge of the single crystal silicon wafer. Then, each crossing electrode 43B or 413B was electrically connected to two of the thin line-shaped electrode 43A or 413A provided an end of the photoelectric conversion part 5 and to the respective inner thin line-shaped electrode 43A or 413A. The correcting electrodes 43B and 413B were provided on the end sides of the wiring members 2.

Note that, the connecting electrodes 4B and 41B, and the crossing electrodes 43B and 413B were placed, respectively, at positions located at about one-fourth of the entire length of the thin line-shaped electrode 43B or 413B from each end of the thin line-shaped electrode 43B or 413B.

<Step 3> Connection of Wiring Members

A long wiring material 2 wound like a roll was prepared. The wiring member 2 used herein was made of copper and the surface thereof was coated by solder. The wiring member 2 has a width of approximately 1.5 mm. This wiring member 2 was cut to a length of approximately 253 mm, considering thickness, size, and the like of the solar cells.

Then, a resin bonding material including an epoxy based thermosetting resin was applied onto the connecting electrodes by a dispenser and the like. In addition, the bonding material was given conductivity by having the resin contain approximately 5% by volume of nickel particles.

For the sample of Example 1, the bonding material was sequentially applied onto the connecting electrode 4B of the solar cell 3A and the connecting electrode 41B of the solar cell 3B so that the bonding material would have a thickness of approximately 30 μm, and a width of approximately 1.2 mm. At this time, no bonding material was applied to parts within approximately 3 mm from the ends of the connecting electrodes 4B and 41B in the extending direction. Then, each wiring member 2 was placed so that the end of the wiring member 2 in the extending direction extends approximately 3 mm beyond the applied bonding material.

For the sample of Example 2, the bonding material was applied to the light receiving surface of the solar cell 32A and the back surface of the solar cell 32B in the arranging direction of the solar cells so that the bonding material would have a thickness of approximately 30 μm and a width of approximately 1.2 mm. At this time, the bonding material was applied to two positions located at about one-fourth of the entire length of the thin line-shaped electrodes 42A or 412A from each end of the thin line-shaped electrode 42A or 412A in the arranging direction of the solar cells. In this application, no bonding material is applied to portions within approximately 4 mm from the peripheral edge of the solar cell 32. Then, the wiring members 2 were sequentially placed so that each of the ends of the wiring members 2 would extend about 3 mm beyond the applied bonding material. In addition, each bonding material was placed so as to extend over all the thin line-shaped electrodes 42A or 412A.

As for the sample of Example 3, the bonding material was sequentially applied onto the light receiving surface of the solar cell 33A and the back surface of the solar cell 33B so that the bonding material would have a thickness of approximately 30 μm and a width of approximately 1.2 mm. At this application, the bonding material was applied in the arranging direction of the solar cells so as to be applied also to the surface of the crossing electrode 43B or 413B. No bonding material was applied to each area within approximately 4 mm from the peripheral edge of the single crystal silicon wafer. In addition, the bonding material was arranged so as to extend over all the thin line-shaped electrodes 43A or 413A that were not electrically connected to the crossing electrode 43B or 413B. Then, the wiring members 2 were sequentially arranged so that each of the ends of the wiring members 2 in the extending direction would extend approximately 3 mm beyond the applied bonding material.

Then, the wiring members 2 placed on each of the solar cells of Examples 1 to 3 were sandwiched by the heaters from the top and bottom, and then heated while being given predetermined pressure. Then, the bonding material was cured to form the bonding layers 7a to bond the wiring members 2. This operation was repeated to connect the plurality of solar cells.

Through this step described above, in each sample of Example, protruding portions that extend approximately 1.5 mm beyond the bonding layers 7a were formed at the ends of the wiring members 2.

<Step 4> Modularization

A sealing sheet 109 made of EVA was placed on the front surface protection member 107 made of a glass substrate. Thereafter, the plurality of solar cells connected by the wiring members 2 was placed. Then, after another sealing sheet 109 made of EVA was further placed thereon, the back surface protection member 108 having a three-layered structure of PET/aluminum foil/PET was placed. Then, these components were integrated by using a well-known laminating method to manufacture each of the solar cell modules according to Examples.

Through this step described above, the sample of Example 1 according to the first embodiment, the sample of Example 2 according to the second embodiment, and the sample of Example 3 according to the third embodiment were formed.

COMPARATIVE EXAMPLE

A sample of Comparative Example was obtained through the same steps as those for the sample according to the first embodiment except the connection of wiring members step. In this step of Comparative Example, the ends of the wiring members 2 were connected to the solar cells with the bonding layers.

(Result)

For the solar cell modules according to Examples 1 to 3 and Comparative Example, production yields were calculated. The production yields were calculated in a way that a solar cell module with a solar cell having any visible breakage or crack formed when the wiring member was connected was regarded as a defective. In addition, for the solar cell modules according to Examples 1 to 3 and the Comparative Example, temperature cycling tests (JIS C8917) were conducted for three times longer period than the period specified in JIS C8917. Then, the degradation rate in output of the solar cell module that was caused by the temperature cycling tests was calculated from a ratio between the conversion efficiency before testing and the conversion efficiency after testing. Table 1 below shows the results.

TABLE 1

|  | Yield | Degradation Rate |
| --- | --- | --- |
| Example 1 | 99.7% | 4.20% |
| Example 2 | 99.7% | 4.20% |
| Example 3 | 99.7% | 4.18% |
| Comparative Example | 99.2% | 4.60% |

The table 1 shows that the yield has improved in Examples 1 to 3 relative to Comparative Example. In Comparative Example, the ends of the wiring members having burrs or deformations are directly bonded to the solar cells by the bonding layers. On the other hand, in Examples 1 to 3, the ends of the wiring members having burrs or deformations are bonded so as to extend beyond the bonding layer. Thus, it is believed that this can prevent occurrence of defects such as breakage, chipping, cracks and microcracks of the solar cells, thereby improving the yields.

In addition, it is seen that the degradation rate also improved in Examples 1 to 3 relative to Comparative Example. In Examples 1 to 3, since the ends of the wiring members having burrs or deformations are bonded so as to extend beyond the bonding layer, it is believed that reduction in output due to defects such as breakage, chipping, cracks and microcracks of the solar cells has been prevented. Thus, it is believed that the degradation rates of Examples 1 to 3 have improved relative to Comparative Example.

Note that, the solar cell modules according to Examples 1 to 3 could achieve similar output characteristics to those of Comparative Example.

(Other Embodiments)

Thus, it is needless to say that the present invention includes various embodiments and the like that have not been described herein. Hence, the technological scope of the present invention should be defined only by the items specific to the invention according to the reasonable CLAIMS.

For example, in the first to third embodiments, the bonding material is applied to the solar cell; however, the bonding material may be applied to the wiring members to perform bonding. Also in such a case, the same effect can be achieved by the ends of the wiring members in the extending direction being bonded so as to form the protruding portions extending beyond the bonding layers. In addition, the bonding material used herein may be a paste or have a sheet shape.

In the embodiments, although electrical connection is established between the light receiving surface and the back surface of the solar cells, the solar cells may be of so-called a back contact type in which electrical connection is established only between the surfaces. In the back-contact type solar cells, an electrode of one conductive type side and an electrode of the other conductive type side are both formed on the back surface of the solar cell. Even in this case, if the ends of the wiring members had protruding portions extending beyond the bonding layers, the same effect could be achieved.

In the third embodiment, each crossing electrode 43B or 413B is connected to two thin line-shaped electrodes 43A or 413A located at portions corresponding to the end part of the wiring material 2; however, the present invention is not limited thereto. For example, the crossing electrode 43B or 413B may be connected to three or more thin line-shaped electrodes 43A or 413A counted from the end side of the wiring material 2 as shown in FIG. 14A or 14B. Further, the crossing electrode 433B or 413B may be connected to only the thin line-shaped electrode 43A1 or 413A1 among the plurality of thin line-shaped electrode 43A or 413A. Also in this case, the crossing electrode 43B or 413B is embedded in the conductive layer 2B of the wiring material. Thus the peeling-off of the end of the wiring material 2 can be prevented.

In the fourth embodiment, each connecting wire 43C or 413C electrically connects six thin line-shaped electrodes 43A or 413A including the thin line-shaped electrode 43A1 or 413A1, however, the present invention is not limited thereto. Each connecting electrode 43C or 413C only needs to connect at least two thin line-shaped electrodes 43A or 413A including the thin line-shaped electrode 43A1 or 413A1.

Further, in the fourth embodiment, the connecting wires 43C and 413C are formed into a zigzag-shape; however, the present invention is not limited thereto. For example, the connecting wire 43C or 413C may be formed in a linear shape or a waved line-shape.

What is claimed is:

1. A solar cell module comprising:
    a first solar cell arranged in an arranging direction having a first connecting electrode formed on a surface thereof in a direction perpendicular to the arranging direction;
    a second solar cell arranged in an arranging direction having a second connecting electrode formed on a back surface thereof in a direction perpendicular to the arranging direction;
    a wiring member electrically connected to the first connecting electrode and the second connecting electrode
    a bonding layer for bonding the wiring member on the surface of the first solar cell; wherein
    the wiring member extends to an arranged direction of the first solar cell and the second solar cell that is perpendicular to the direction of the connecting electrodes, wherein
    the wiring member has a protruding portion on the surface of the first solar cell and extending away from the second solar cell and beyond the bonding layer at an end of the wiring member and wherein
    an end of the protruding portion has burrs or deformations and is located inside a peripheral edge of the first solar cell and is located closer to the peripheral edge of the first solar cell away from the second solar cell than the bonding layer is to the peripheral edge of the first solar cell away from the second solar cell and further, the end of the protruding portion is located closer to the peripheral edge of the first solar cell away from the second solar cell than to the peripheral edge of the first solar cell closer to the second solar cell, wherein the burrs or deformations extend perpendicular to the first solar cell surface less than a combined thickness of the adjacent connecting electrode and its bonding layer.

2. The solar cell module according to claim 1, wherein a space is provided between the surface of the first solar cell and a surface of the protruding portion facing the surface of the solar cell.

3. The solar cell module according to claim 1, wherein the bonding layer is conductive, and
    the wiring member is electrically connected to the connecting electrode through the bonding layer.

4. The solar cell module according to claim 1, wherein
    a plurality of solar cells including the first and second solar cells is arranged along an arranging direction,
    the connecting electrode is formed on the surface of the first or second solar cells along
    the direction perpendicular to the arranging direction, and includes parts of a plurality of thin line-shaped electrodes arranged parallel to each other, and
        the wiring member is placed on the plurality of thin line-shaped electrodes along the arranging direction.

5. The solar cell module according to claim 4, further comprising
    a crossing electrode electrically connecting one thin line-shaped electrode and another thin line-shaped electrode adjacent thereto, wherein
        the outermost thin line-shaped electrode is electrically connected to an outermost end area of the wiring member, and
    the outermost thin line-shaped electrode and the adjacent thin line-shaped electrode are included in the plurality of thin line-shaped electrodes of the solar cell.

6. The solar cell module according to claim 5, wherein the crossing electrode is placed so as to overlap with the wiring member.

7. The solar cell module according to claim 1, wherein the burrs or deformations at the end of the protruding portion are protruding toward the first solar cell surface.

8. The solar cell module according to claim 7, wherein the end of the protruding portion has burrs.

9. A method of manufacturing a solar cell module, comprising:
    a first step of preparing a long wiring material wound like a roll;
    a second step of forming a wiring member by cutting the long wiring material into predetermined length having first and second ends wherein burrs or deformations are located at the ends; and
    a third step of bonding the wiring member onto a first solar cell arranged in an arranging direction and having a first connecting electrode on a surface thereof formed in a direction perpendicular to the arranging direction and a second solar cell arranged in an arranging direction and having a second connecting electrode on a surface thereof formed in a direction perpendicular to the arranging direction with a bonding layer, wherein
    in the third step, the end of the wiring member is placed inside a peripheral edge of the solar cell, wherein the wiring member has a protruding portion on the surface of the first solar cell and extending away from the second solar cell and beyond the bonding layer at the end of the wiring member and wherein
    the end of the wiring member is placed closer to the peripheral edge of the first solar cell away from the second solar cell than the bonding layer is to the peripheral edge of the solar cell away from the second solar cell, and
    the end of the protruding portion is placed closer to the peripheral edge of the first solar cell away from the second solar cell than to the peripheral edge of the first solar cell closer to the second solar cell, and is placed from the bonding layer to the peripheral edge of the solar cell and the wiring member extends to an arranged direction of the first solar cell and the second solar cell that is perpendicular to the direction of the connecting electrodes, and wherein the burrs or deformations extend perpendicular to the first solar cell surface less than a combined thickness of the adjacent connecting electrode and its bonding layer.

10. The method of manufacturing a solar cell module according to claim 9, wherein in the third step, a space is provided between the end of the wiring member and the first solar cell.

11. The method of manufacturing a solar cell module according to claim 9, wherein the first and second solar cells include a connecting electrode formed on a surface thereof, the bonding layer is conductive, and in the third step, the wiring member is electrically connected to the connecting electrode through the bonding layer.

12. The method of manufacturing a solar cell module according to claim 9, wherein the connecting electrode is formed on the surface of the first and second solar cells along a predetermined direction, and includes parts of a plurality of thin line-shaped electrodes arranged parallel to each other, and the wiring member is placed on the plurality of thin line-shaped electrodes along the direction perpendicular to the predetermined direction.

13. The method of manufacturing a solar cell module according to claim 12, wherein the first and second solar cells include crossing electrodes electrically connecting one thin line-shaped electrode and another thin line-shaped electrode adjacent thereto, the one thin line-shaped electrode is electrically connected to an outermost end area of the wiring member, the one thin line-shaped electrode and the adjacent thin line-shaped electrode are included in the plurality of thin line-shaped electrodes, and in the third step, the crossing electrode is placed so as to overlap with the wiring member.

* * * * *